US006536014B1

(12) United States Patent
McClannahan et al.

(10) Patent No.: US 6,536,014 B1
(45) Date of Patent: Mar. 18, 2003

(54) REUSABLE CONFIGURATION TOOL

(75) Inventors: Gary McClannahan, Rochester, MN (US); John Emery Nordman, Rochester, MN (US); Scott Thomas Senst, Rochester, MN (US); John Shaffer, Rochester, MN (US); Todd Jason Youngman, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/964,300

(22) Filed: Sep. 26, 2001

(51) Int. Cl.[7] .............................................. G06F 17/50
(52) U.S. Cl. ................... 716/1; 716/5; 716/18
(58) Field of Search ........................... 716/1–2, 4–5, 716/16–18; 703/14, 15; 326/38, 39

(56) References Cited

U.S. PATENT DOCUMENTS

| 5,613,119 A |   | 3/1997 | France et al. ............. 395/651 |
| 5,705,938 A | * | 1/1998 | Kean ......................... 716/18 |
| 5,801,958 A | * | 9/1998 | Dangelo et al. ............ 326/39 |
| 6,023,565 A | * | 2/2000 | Lawman et al. ............ 716/1 |
| 6,199,031 B1 | * | 3/2001 | Challier et al. ............ 703/14 |

OTHER PUBLICATIONS

Series of screen shots disclosed May 2000.

* cited by examiner

*Primary Examiner*—Matthew Smith
*Assistant Examiner*—Paul Dinh
(74) *Attorney, Agent, or Firm*—Moser, Patterson & Sheridan, LLP

(57) ABSTRACT

Method, system and signal bearing medium for configuring an integrated circuit are provided. One embodiment provides a method for configuring an integrated circuit, comprising: providing a user interface for displaying one or more abstract data elements for user selection, wherein the one or more abstract data elements represent one or more controls associated with characteristics of the integrated circuit; receiving a user selection of an abstract data element; validating associated abstract rules for the user selected abstract data element; and validating product rules for the one or more product data elements associated with the user selected abstract data element, wherein the one or more product data elements represent one or more controllable features of the integrated circuit.

23 Claims, 16 Drawing Sheets

REUSABLE CONFIGURATION TOOL

BACKGROUND OF THE INVENTION

1. Field of the Invention

The present invention generally relates to integrated circuit configuration tools. More particularly, the present invention relates to a reusable configuration tool for ensuring valid configurations for integrated circuits.

2. Description of the Related Art

As the complexity of integrated circuits (ICs) grows, the need to assist users with the setup of complex ICs becomes increasingly important. A complex IC typically contains a large number of valid configurations for the register settings, memory configurations, mode pins, etc., but also as many or even more invalid configurations. Users of these complex ICs typically rely on the IC manufacturer's written specification and application notes for the specific IC to configure the IC and to determine whether the configuration may be valid. However, the user usually ends up with a time-consuming trial and error method for ensuring that the configuration for the IC is valid. Also, the IC manufacturer may be over-burdened by the required technical support to the user for a variety of ICs. Thus, a tremendous amount of resources are devoted by both the user and the IC manufacturer to ensure valid IC configurations.

Therefore, there is a need for a configuration tool for ensuring valid configurations for integrated circuits. It would be desirable for the configuration tool to simplify an IC configuration process. Further, it would be desirable for the configuration tool to be utilizable for configuring a variety of ICs.

SUMMARY OF THE INVENTION

Method, system and signal bearing medium for configuring an integrated circuit are provided. One embodiment provides a method for configuring an integrated circuit, comprising: providing a user interface for displaying one or more abstract data elements for user selection, wherein the one or more abstract data elements represent one or more controls associated with characteristics of the integrated circuit; receiving a user selection of an abstract data element; validating associated abstract rules for the user selected abstract data element; and validating product rules for the one or more product data elements associated with the user selected abstract data element, wherein the one or more product data elements represent one or more controllable features of the integrated circuit.

Another embodiment provides a system for configuring an integrated circuit. The system comprises: a user interface for displaying one or more abstract data elements for user selection; a configuration database containing an abstract rules database and a product rules database; and a core tool connected to the user interface and the configuration database, the core tool configured to perform an operations for configuring an integrated circuit.

Another embodiment provides signal bearing comprising a program which, when executed by a processor, performs an operation for configuring an integrated circuit.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
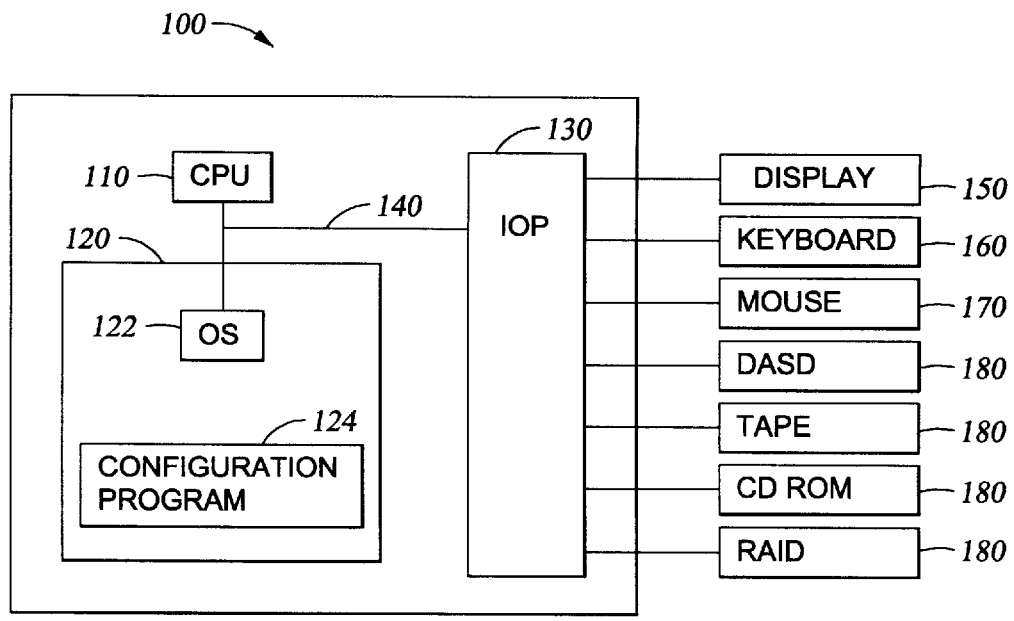
FIG. 1 is a block diagram illustrating one embodiment of a computer system implementing one embodiment of a configuration system.

Embodiments of the invention generally provide methods and apparatus for configuring an integrated circuit. One embodiment provides a configuration tool for ensuring valid configurations for integrated circuits. The configuration tool guarantees that the user only creates valid configuration for the complex IC, thereby reducing the user's (or customer's) time to market as well as the amount of support provided by the IC manufacturer to the user/customer. In one aspect, the configuration tool simplifies an IC configuration process by providing an interactive specification through a graphical user interface, and complex configuration problems are abstracted and simplified so that the user need not have knowledge for detailed low level setting of the IC. Another aspect of the invention simplifies the complexity of the configuration rules by separating the rules into higher level abstract rules and lower level product rules. In another aspect, the configuration tool may be utilized for configuring a variety of ICs simply by changing the configuration database connected to the configuration tool. Furthermore, the configuration tool may be utilized to provide a variety of valid configurations for the same IC.

One embodiment of the invention is implemented as a program product for use with a computer system such as, for example, the computer system 100 described below. The program(s) of the program product defines functions of the embodiments (including the methods described below with reference to FIGS. 3 and 5–7) and can be contained on a variety of signal/bearing media. Illustrative signal/bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the invention, whether implemented as part of an operating system or a specific application, component, program, module, object, or sequence of instructions may be referred to herein as a "program". The computer program typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

FIG. 1 is a block diagram illustrating one embodiment of a computer system implementing one embodiment of a configuration system. The computer system 100 generally comprises a central processing unit (CPU) 110, a main memory 120, and an input/output (I/O) processor 130. These system components are interconnected through a system bus 140. Input/output devices, such as a display monitor 150, a keyboard 160, and a pointing device 170 (e.g., mouse), are connected to the computer system 100 through the I/O processor 130. One or more storage devices 180, such as RAID systems, direct access storage devices (DASDs), tape storage devices, CD-ROM (compact disc read only memory), disk drives and other optical or magnetic storage devices, may be connected to the computer 100 through the I/O processor 130. Data files, software programs, and other information may be stored on the storage devices 180.

One or more software programs, such as an operating system 122, may be stored in the main memory 120 or alternatively, in the storage devices 180. The operating system 122 is a suitable multitasking operating system; however, those skilled in the art will appreciate that the spirit and scope of the present invention is not limited to any one operating system. Operating system 122 may support a variety of programming environments. Other software programs, such as a configuration program 124 for configuring integrated circuits, may also be stored in the main memory 120, or alternatively, in the storage devices 180. Operation of the computer system 100 may be controlled by user input through I/O devices such as the keyboard 160 and the pointing device 170.

At this point, it is important to note that while embodiments of the present invention have been (and will continue to be) described in the context of a fully functional computer system, those skilled in the art will appreciate that embodiments of the invention are capable of being distributed as a program product via floppy disk, CD ROM, or other form of recordable media, or via any type of electronic transmission mechanism.

Figure 2:
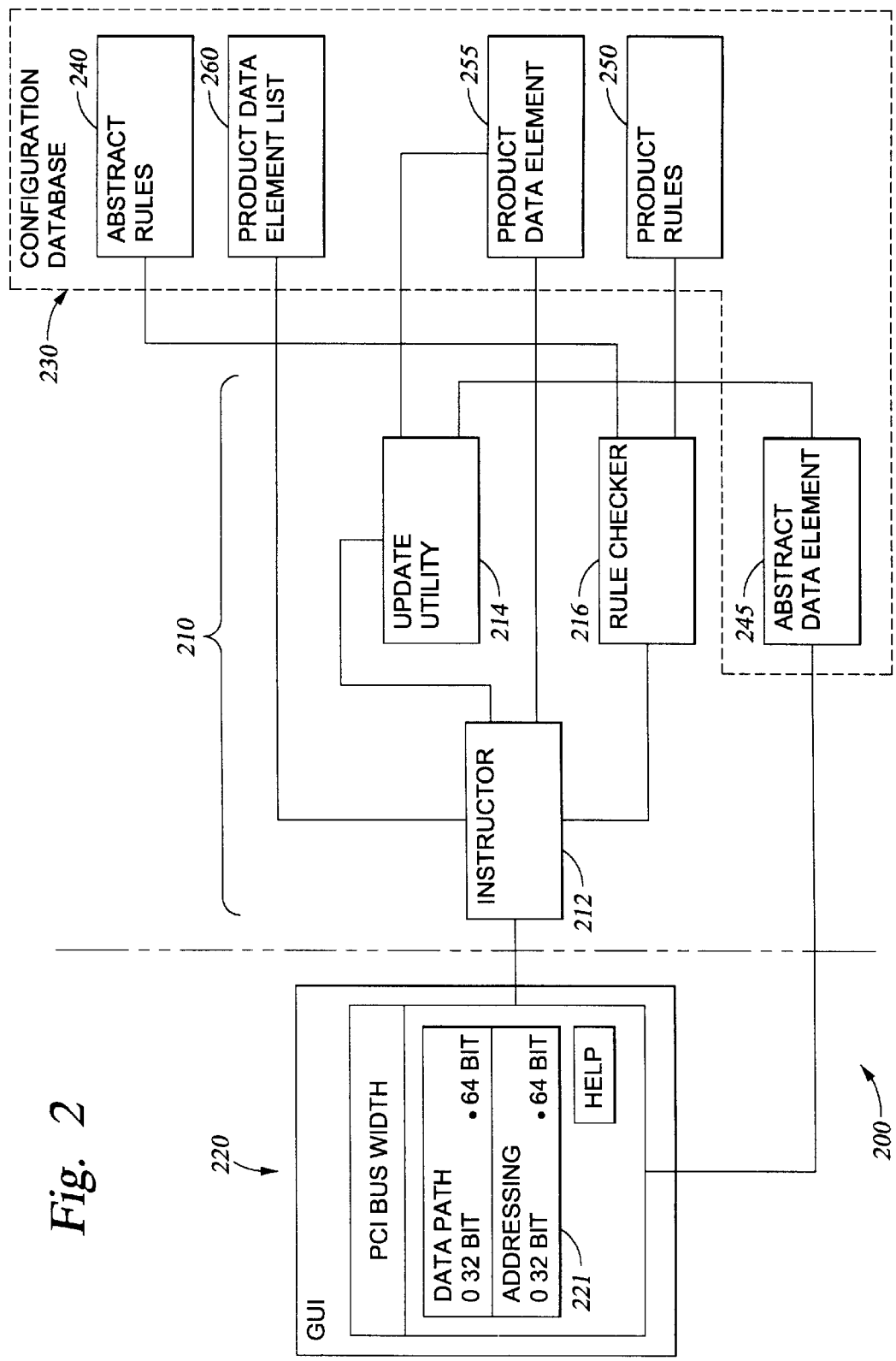
FIG. 2 is a block diagram illustrating one embodiment of a configuration system.

FIG. 2 is a block diagram illustrating one embodiment of a configuration system. The configuration system 200 generally includes a core tool 210, an abstract interface 220 and a configuration database 230. In one embodiment, the core tool 210 and the abstract interface 220 may be part of the configuration program 124 as shown in FIG. 1. The configuration database 230 may include an abstract rules database 240, an abstract data element database 245, a product rules database 250, a product data element database 255, and a product data element list database 260. Each of these databases may reside on a storage device 180 as shown in FIG. 1.

In one embodiment, the core tool 210 comprises an Instructor 212, an Update Utility 214, and a Rule Checker 216. The Instructor 212 determines which product data elements are associated with an abstract data element (also referred to as a control). Also, the Instructor 212 communicates with the Update Utility 214 to perform updates to particular product data elements or abstract data elements, and the Instructor 212 communicates with the Rule Checker 216 to validate particular product rules and abstract rules.

The Update Utility 214 updates fields for an abstract data element in the abstract data element database 245 and fields for a product data element in the product data element database 255. An update is accomplished by copying Next State values to Current State values after all rules have been validated. Data or information passed between the Instructor 212 and the Update Utility 214 includes the product data element or the abstract data element to be updated.

The Rule Checker 216 checks the product rules and abstract rules from the respective databases. Specifically, the Rule Checker 216 retrieves the specific Abstract Rule to execute from the Abstract Rules database 240, and retrieves the specific Product Rule to execute from the Product Rules database 250. Data or information passed between the Instructor 212 and the Rule Checker 216 includes a pointer to a rule (Product Rule or Abstract Rule) to be checked and the result of the check.

In one embodiment, the Abstract Interface 220 is a graphical user interface (GUI) utilized for allowing the users of the tool to make choices about the configuration of a complex IC. The Abstract Interface 220 may present input selections to the user in a variety of formats, including list boxes, combo boxes, radio buttons, check boxes, tables and bar charts. Data or information passed between the Abstract Interface 220 and the Instructor 212 includes the identifier of the GUI control that was manipulated, and the value it was manipulated to.

The abstract rules database 240 contains all of the abstract rules utilized by the core tool 210. As used herein, an abstract rule generally refers to a rule which governs the operations associated with an abstract data element. One or more abstract rules may be written for each abstract data element. The abstract rules allow a user to enforce high level application conditions without knowing the specific mechanisms that must be set within the complex IC to accomplish those conditions. For each GUI control (i.e., abstract data element) in the Abstract Interface 220, there is at least one abstract rule.

The product rules database 250 contains the product rules utilized by the core tool. As used herein, a product rule generally refers to a rule which governs how to set a product data element appropriately. A product may be written for each product data element. For example, a product rule for a counter register may govern the reset value of the counter register and the appropriate time to reset the counter register. The product rules allow a user to enforce specific conditions that must be met for the product to function properly without knowledge of the high level conditions of an application The product data element list database 260 contains the lists of data elements that must be validated for the control being manipulated by the user. There can be 0 to n number of product data elements in the list. The more "abstract" the function, the more data elements in the list. A list of product data elements is associated with each abstract data element (i.e., control), and the lists are contained in the product data element list database 260. Data or information passed between the Instructor 212 and the product data element list database 260 includes the list of product data elements to be manipulated for a given GUI control manipulation.

The product data element database 255 contains the settings of controllable features within an IC, e.g., programmable registers. Each controllable feature may be represented by a product data element. In one embodiment, the various registers in an integrated circuit are broken down into a plurality of product data elements. These product data elements can represent anywhere from one bit in a register to 32 bits in a register, depending on the function of the register. For example, one product data element may be created for a 32-bit counter register. As another example, a control register may be broken down into 32 individual bits wherein each bit has a distinct function, and each bit may be represented by one product data element. A product rule may be written for each product data element that governs how to set that product data element appropriately. For example, for a counter register, the product rule may govern the reset value of the counter register (whether all 0's, all 1's or some combination of 0's and 1's) and the appropriate time to reset the counter register.

The abstract data element database 245 contains the settings for each abstract data element (i.e., the controls shown in the GUIs). As used herein, an abstract data element represents a control associated with a characteristic of the IC. For example, an abstract data element may represent a PCI Bus Width (e.g., 32 bit or 64 bit). Data or information passed between the Abstract Interface 220 and the abstract data elements database 245 includes the current settings for each of the GUI controls. Each control or abstract data element in the Abstract Interface 220 may be linked to one or more product data elements, depending on the level of abstraction of the concept being represented on the graphic user interface screen. In general, the level of abstraction dictates how many product data elements are manipulated by user input. The abstraction level may be at a high level to reduce the number of user inputs needed to configure a certain portion of the IC. For example, the physical interface of an IC may be abstracted at a high level as an abstract data element, and a user may be able to select as input a specific vendor part to which the IC can be connected, and the configuration system 200 takes that abstract data element input and sets up a plurality of product data elements inside the IC.

As an example of a level of abstraction, consider the Abstract Interface 220 shown in FIG. 2. Illustratively, the Abstract Interface 220 shows a PCI Bus Width Addressing control 221 which is specific to the PCI bus interface and a very targeted representation of a function inside the IC. Accordingly, there may be only a few (e.g., two or less) product data elements referencing this addressing control.

Although the embodiments of methods and apparatuses for configuring a system are described below utilizing examples applicable to configuration of an integrated circuit, it is understood that further embodiments may be adapted to configure other systems by changing the databases associated with the core tool. Furthermore, an integrated circuit may be easily re-configured into another valid configuration utilizing embodiments of the invention.

Figure 3:
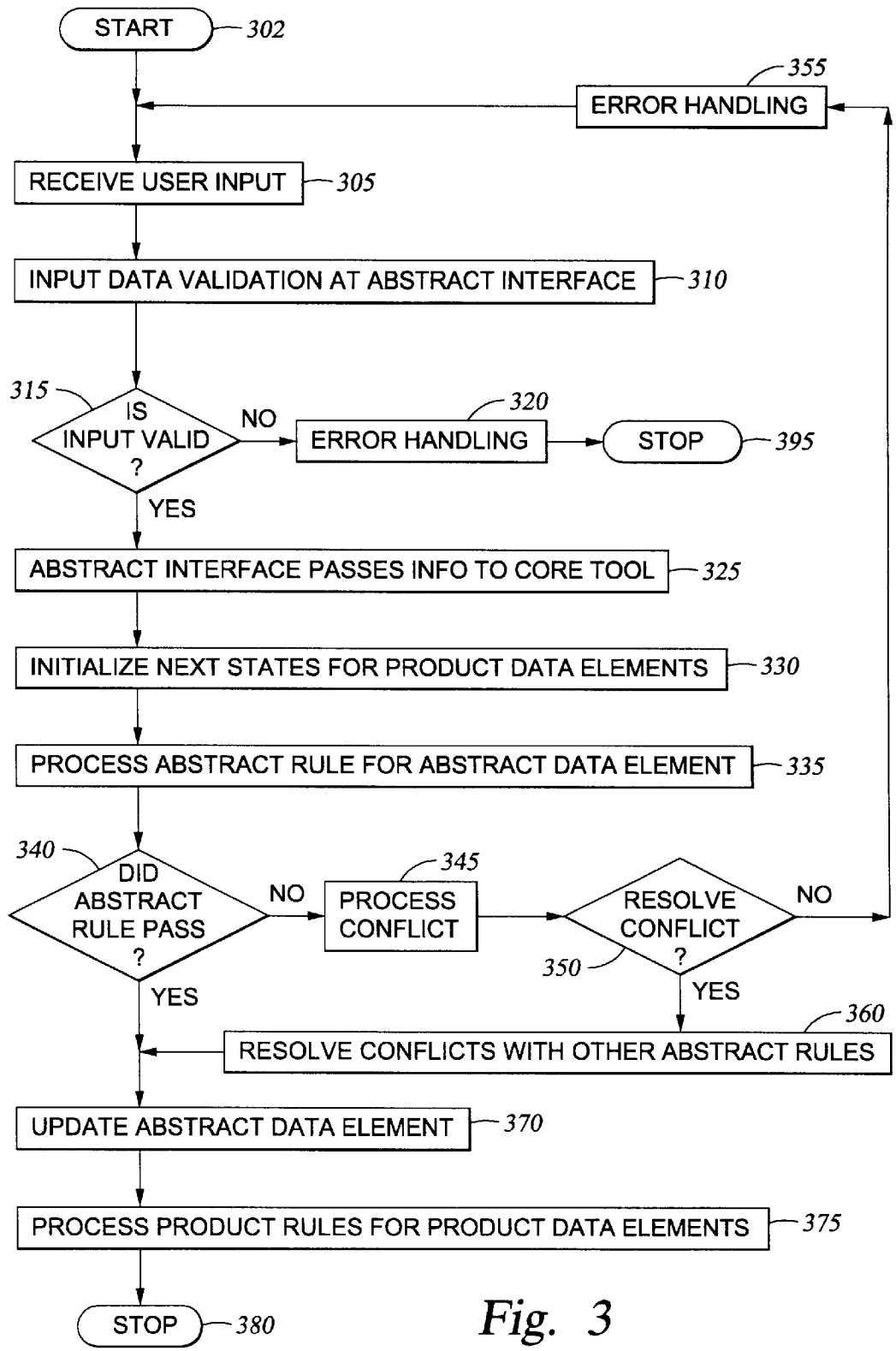
FIG. 3 is a flow diagram illustrating one embodiment of a method for configuring an integrated circuit.

FIG. 3 is a flow diagram illustrating a method 300 for ensuring a valid configuration of an integrated circuit. The method 300 begins at block 302 and proceeds to receive a user input at block 305. In one embodiment, the user input may be entered from a dialog box generated from the Abstract Interface 220. Each dialog box may display the specific controls (referred herein also as abstract data elements) with which the user would interact.

Figure 4A:
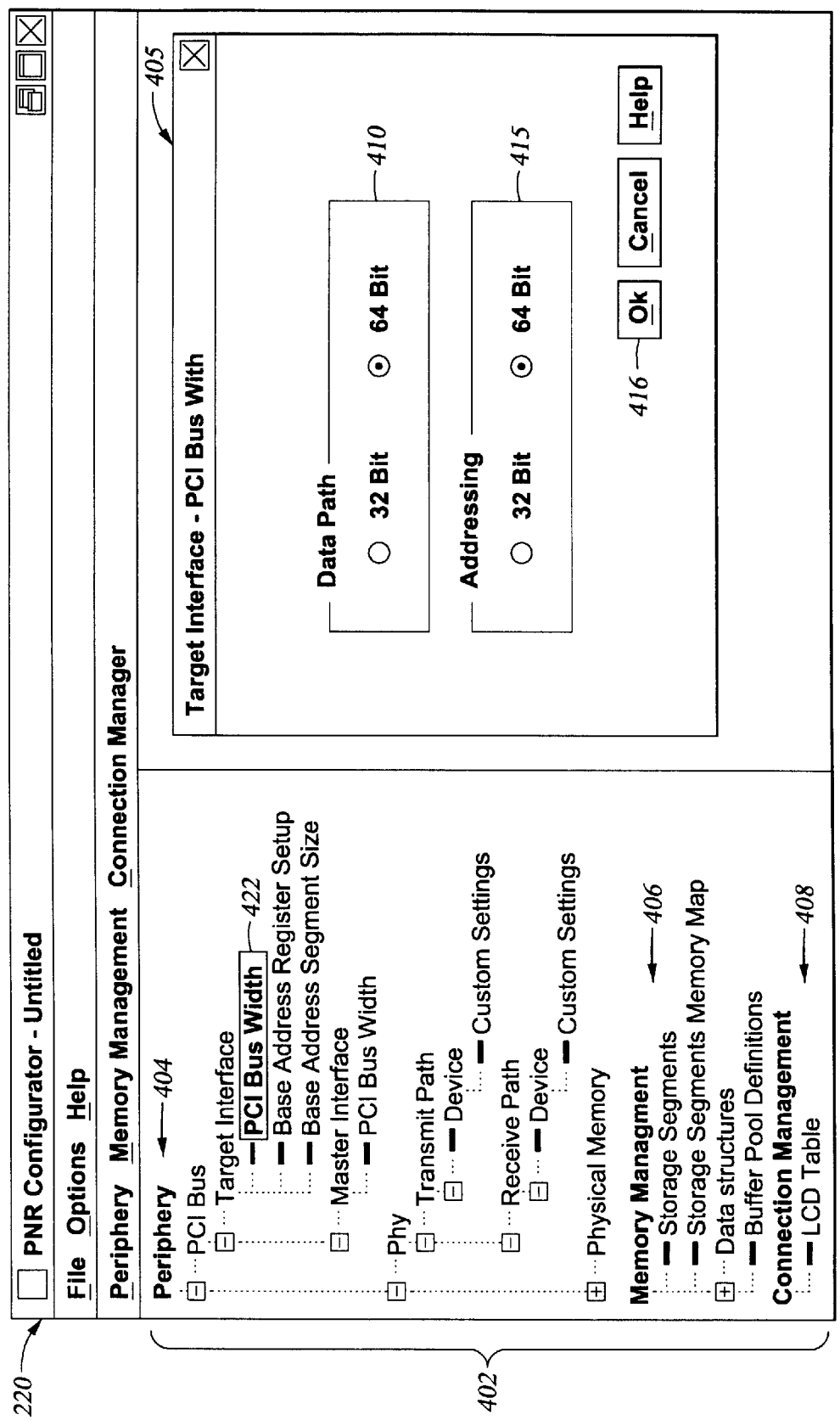
FIGS. 4A–G are exemplary embodiments of graphic user interfaces utilized for configuring an integrated circuit.

FIGS. 4A–G are exemplary embodiments of the Abstract Interface 220 which is utilized for configuring an integrated circuit. Referring to FIG. 4A, the Abstract Interface 220 includes a directory 402 for user selection of a particular component of the integrated circuit to be configured. In one embodiment, the directory 402 is presented in an expandable/collapsible tree format which displays the categories of the integrated circuit components as well as all available user selections of the components to be configured. The expanded tree format of the directory 402 illustrates the different levels of abstraction utilized for configuring an IC. In one embodiment, on a broad level of abstraction, the components of the IC are divided into the Periphery category 404, the Memory Management category 406 and the Connection Management category 408. Each of these categories may provide subcategories (e.g., PCI Bus subcategory 412) corresponding to lower levels of abstraction. To simplify the IC configuration process, the subcategories at the lower levels of abstraction may provide dialog boxes which display the product data elements (i.e., controls) for user interaction. To configure a component of the IC, the user may select the subcategory for the component to be configured. For example, the user may select the PCI Bus Width subcategory 422 to display a dialog box 405 showing the product data elements to be configured under this subcategory. The user may interact with the Data Path control 410 and the Addressing control 415 for the Periphery/PCI Bus/Target Interface/PCI Bus Width dialog box 405.

Figure 4B:
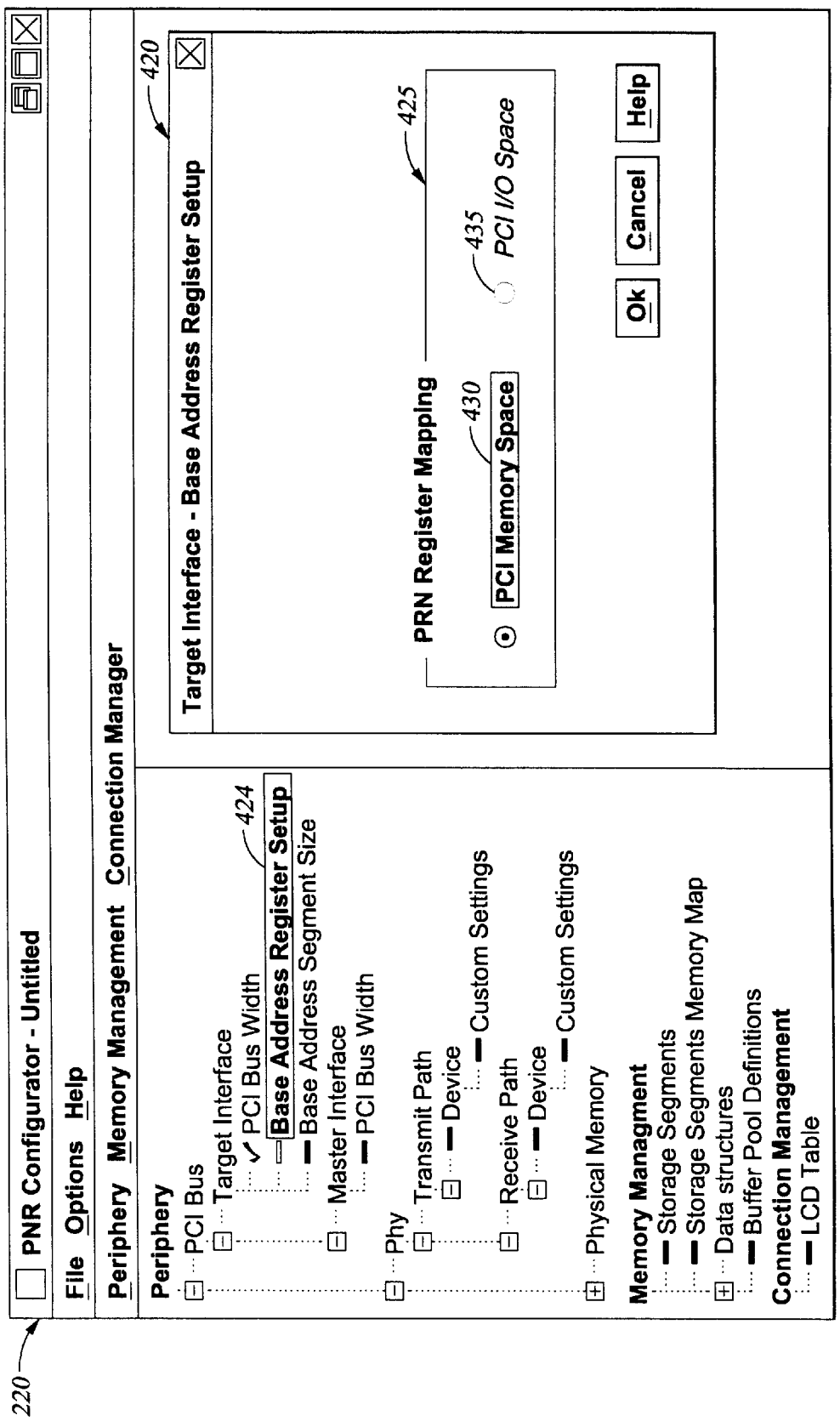

Each dialog box may present default selections of the controls, e.g., 64 bit Data Path and 64 bit Addressing as shown in FIG. 4A. If the user accepts the default selections (i.e., clicks the OK button 416) and proceeds to configure the Periphery/PCI Bus/Target Interface/Base Address Register Setup 424, another dialog box 420 is generated from the Abstract Interface 220 showing the user selections for the PNR Register Mapping control 425, as shown in FIG. 4B, with a default selection of PCI Memory Space 430. The other user selection of PCI I/O Space 435 is not available (e.g., grayed out) because of the previous user selections (i.e., 64 bit Addressing in dialog box 405 in FIG. 4A).

The method 300 may perform a data validation for the user input through the Abstract Interface 220 at block 310. This step may be optional depending on the user interface. Generally, if the user input is selected from an enumerated list which is generated by the Abstract Interface 220, there is no need to perform the user input validation because the user selection is deemed valid. However, if a user input is a text field (e.g., a numerical field with a limit between 1 and 100), the user input needs to be validated, and an error flag is set if a user inputs a text field outside the limits (e.g., a numerical input value of 150 for the above example). Block 315 is a query box for determining whether an error flag is set to indicate that the user input is invalid. If an error flag is set, the method 300 proceeds to an error handling procedure at block 320.

In one embodiment, the error handling procedure 320 may display the details of the user input error (e.g., show numerical limits if the user input value is outside the limits) so that the user may enter another input that is within the limitations of the text field. The method 300 may be stopped at block 395, and the user may trigger another start of the method 300 by selecting another parameter to be entered through the Abstract Interface 220. In another embodiment, the error handling procedure 320 may return the user to the previous user input screen and request another user input through the Abstract Interface 220, and the method 300 is returned to block 305.

If no error flag is set at block 315, the method 300 then proceed to block 325, wherein the Abstract Interface 220 passes the user input selection data to the Instructor 212 of the Core Tool 210. The user input selection data may include an identifier and a value. For example, referring to FIG. 4C, the user interacts with the Addressing control 415 for the Periphery/PCI Bus/Target Interface/PCI Bus Width dialog box 405 and selects 32 bits for the Addressing control 415. In this example, the user input selection data includes "PCI Bus Width Addressing" as the identifier and "32 bit" as the value. As another example, referring to FIG. 4D, the user then proceeds to configure the PNR Register Mapping control 425 in the Periphery/PCI Bus/Target Interface/Base Address Register Setup dialog box 420, with available selections of PCI Memory Space 430 (default selection) and PCI I/O Space 435. FIG. 4E shows the user selection of PCI I/O space 435, and the user input selection data includes "Base Address Register Setup" as the identifier and "PCI I/O Space" as the value.

Figure 5:
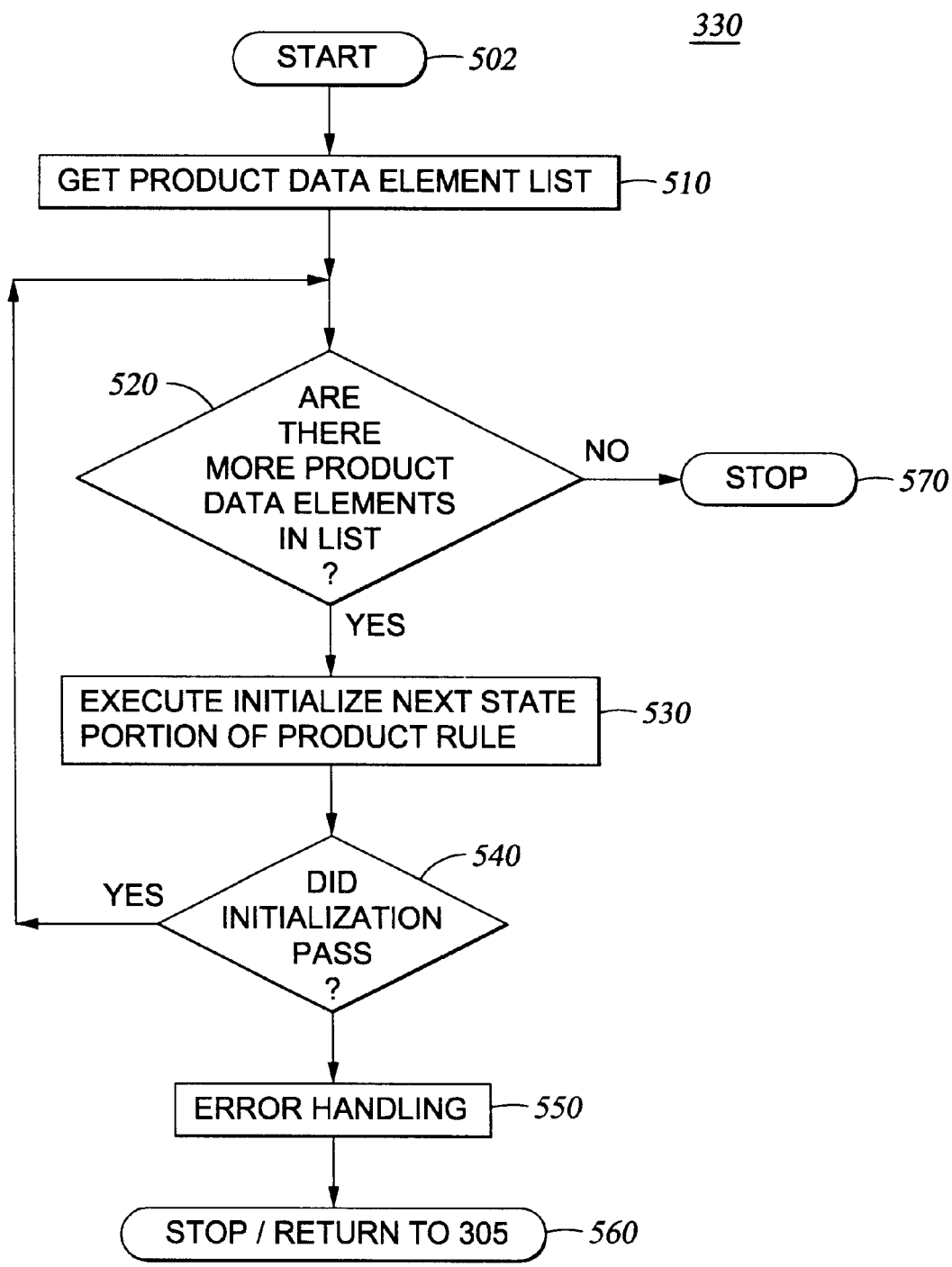
FIG. 5 is a flow diagram illustrating one embodiment of a process for initializing next states of product data elements.

After receiving the identifier and value, the method 300 proceeds to initialize the next states of the product data elements at block 330. FIG. 5 is a flow diagram illustrating one embodiment of a process 330 for initializing the next states of the product data elements. The process 330 begins at block 502 and proceeds to get a product data element list associated with the input identifier (e.g., PCI Bus Addressing) at block 510. Each product data element is processed through a do-loop starting at block 520, which is a query box determining whether any product data element remains to be processed. If so, the process 330 proceeds to initialize the next state of the product data element being processed currently at block 530. In one embodiment, the current state may be saved in memory so that, if needed, the product data element may revert to the original state.

The next state initialization calculates what state the product data element needs to be set to and sets the next state of the product data element to that state. This next state does not necessarily represent a valid configuration, but will be checked later. Several types of calculation may be performed to determine what the next state needs to be. The calculation can be any function, including look-up function from table, mathematical function such as utilizing a scale factor to calculate next state value, etc. For example, a 32 bit addressing may have a transform value of "1" (e.g., a look-up function from data table), and a 64 bit addressing may be transformed to a value of "0".

The process 330 then proceeds to determine whether the next state initialization passes for the product data element being processed currently at query to block 540. If an error occurs with the next state initialization (i.e., did not pass at block 540), the process 330 proceeds to an error handling procedure at block 550 and returns to block 305 at block 560. If the next state initialization passes for the product data element at block 540, the process 330 loops back to block 520 to process the next product data element. After all product data elements have been initialized to the next states, the process 330 stops at block 570 and returns to method 300.

Figure 4C:
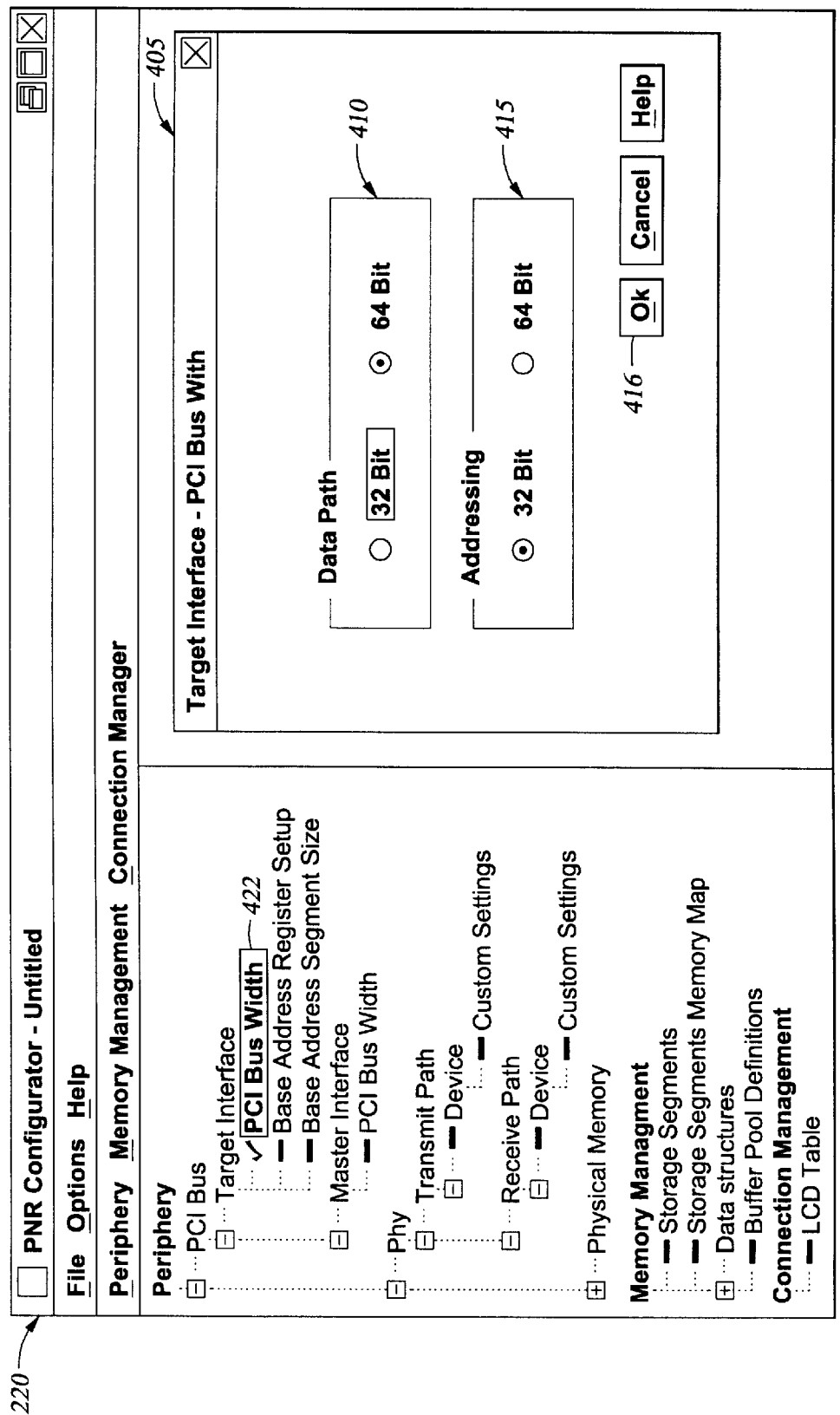
Figure 4D:
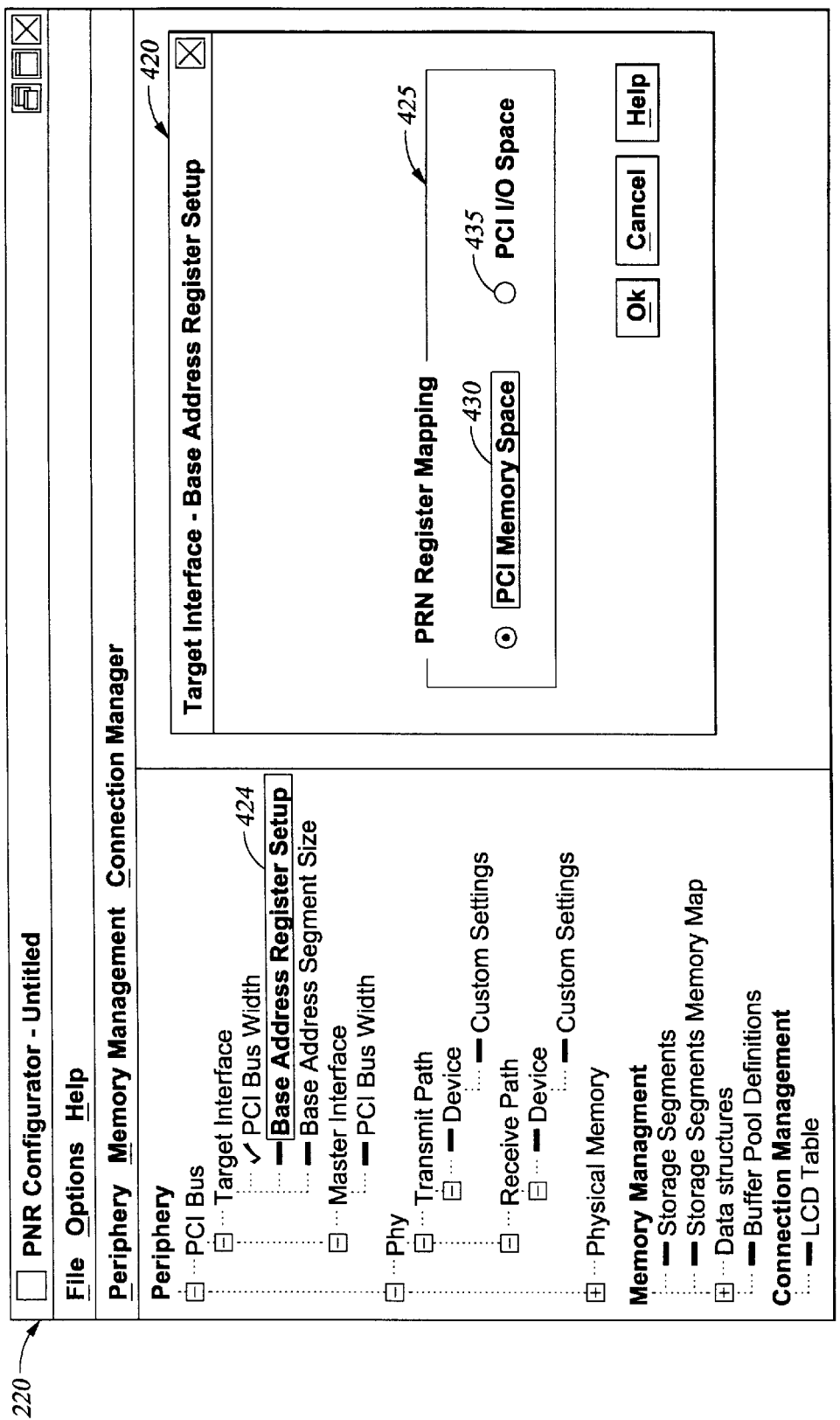
Figure 4E:
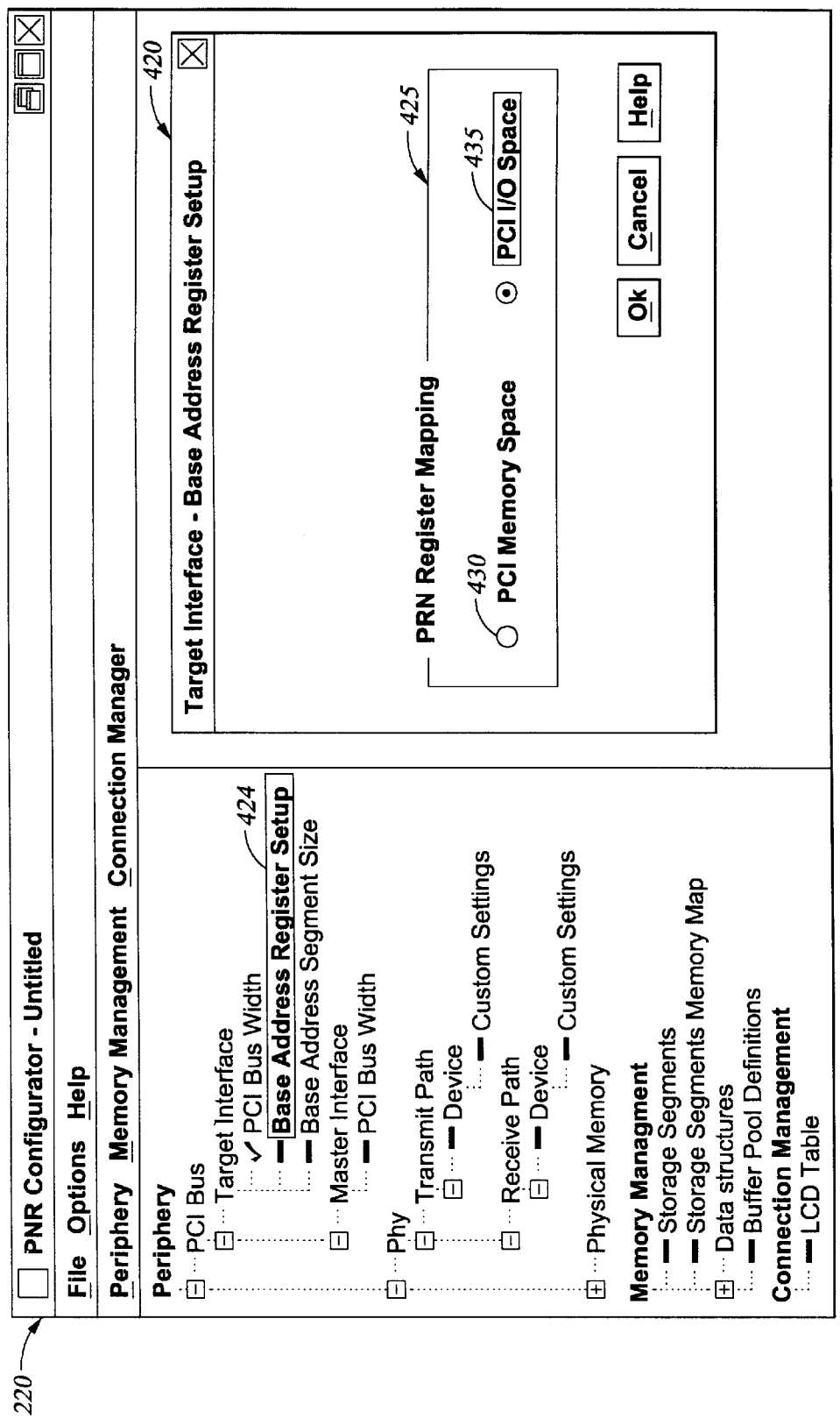

As an example of the results of an next state initialization, referring to FIG. 4C, the user interacts with the Addressing control 415 for the Periphery/PCI Bus/Target Interface/PCI Bus Width dialog box 405 and selects 32 bits for the Addressing control 415. After the core tool executes the initialize next state process, the PCI Memory Space 430 and PCI I/O Space 435 are both available as user selections in the PNR Register Mapping control 425 in the Periphery/PCI Bus/Target Interface/Base Address Register Setup dialog box 420, as shown in FIG. 4D, reflecting the next state values for the product data elements associated with 32 bit addressing.

Referring back to FIG. 3, the method 300 continues to block 335 to process abstract rules for the abstract data element. This may be accomplished utilizing the Rule Checker 216 and consolidating the next state values for the product elements associated with the abstract data element with the information in the Abstract Rules database. The method 300 then proceeds to query whether the abstract data element passed the associated abstract rules.

If the abstract data element did not pass, then the method 300 proceeds to process the conflict at block 345. At block 350, the user is queried whether to resolve the conflict. If the user chooses not to resolve the conflict, the method 300 returns to the previous Abstract Interface screen in which the user entered an input that resulted in the conflict at block 355, and the user may be informed of the details that resulted in the conflict. If the user chooses to resolve the conflict, the method 300 proceeds to resolve one or more conflicts with other abstract rules at block 360. The abstract data elements have dependencies among themselves. The configurator system may be written such that these dependencies can be resolved based on user input. All abstract data elements and product data elements can be made consistent with the user choices made.

Figure 4F:
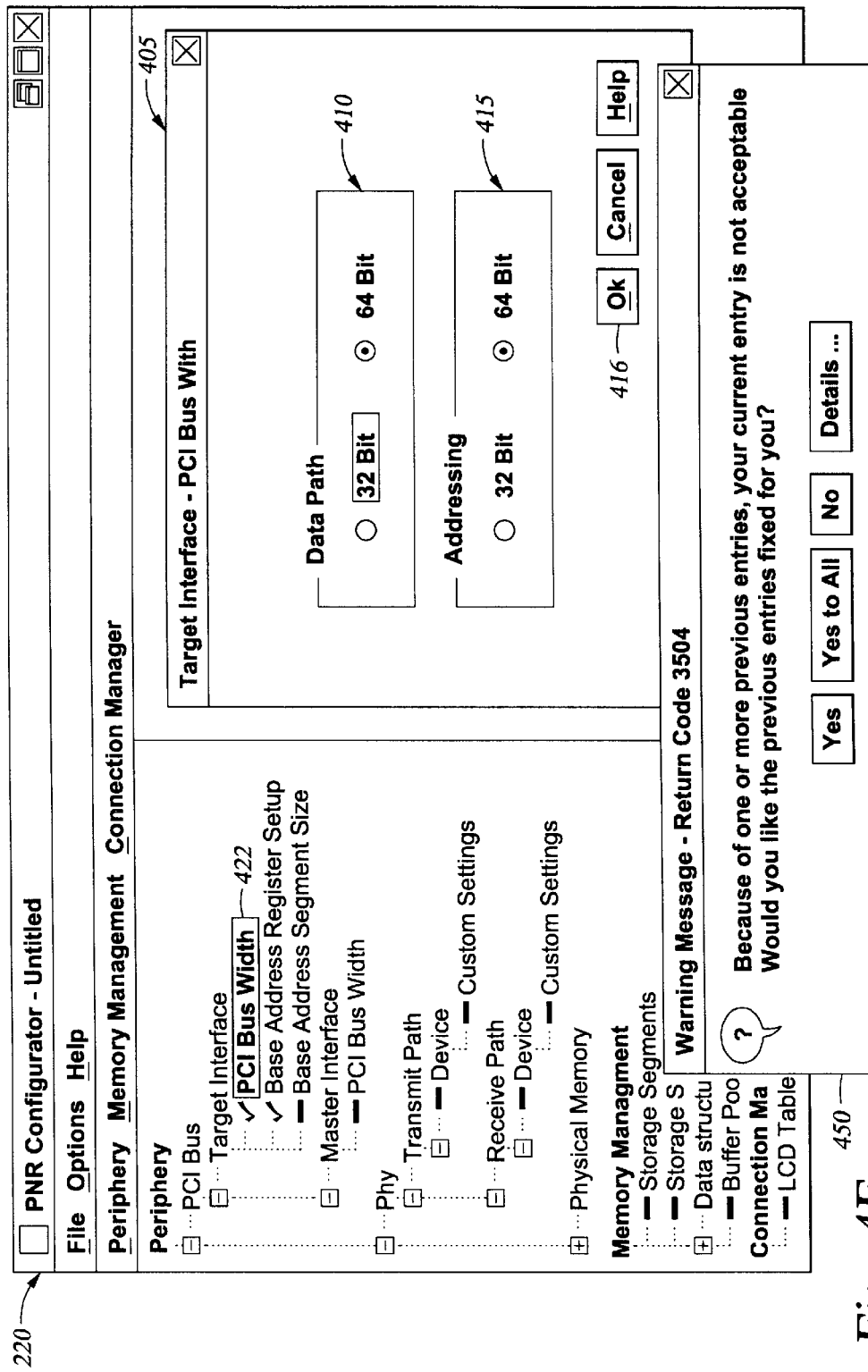
Figure 4G:
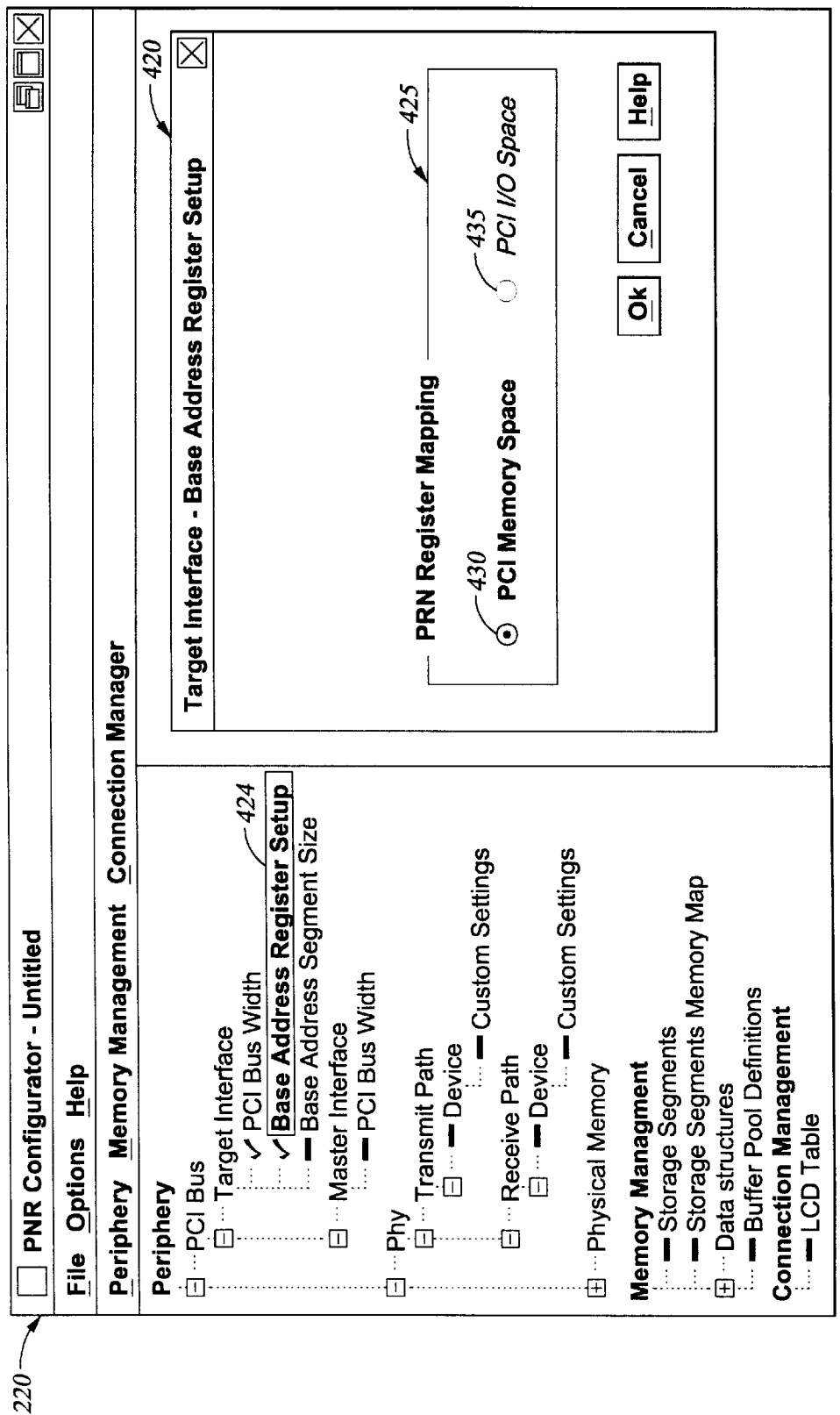

For example, referring to FIG. 4E, the user selects PCI I/O Space 435 in the PNR Register Mapping control 425 in the Periphery/PCI Bus/Target Interface/Base Address Register Setup dialog box 420. The user then selects 64-bits for the Addressing control 415 for the Periphery/PCI Bus/Target Interface/PCI Bus Width dialog box 405 as shown in FIG. 4F. Because the user has previously selected 32-bits for the Addressing control 415 for the PCI Bus Width dialog box 405 so that PCI I/O Space 435 became an available selection, the Rule Checker 216 detects a conflict when executing block 335. As shown in FIG. 4F, a warning message dialog box 450 is displayed to the user. If the user selects to resolve the conflict, the method 300 resolves the conflict and displays the corrected selections, as shown in FIG. 4G, with the PCI Memory Space 430 selected for the PNR Register Mapping control 425 in the Periphery/PCI Bus/Target Interface/Base Address Register Setup dialog box 420. The PCI I/O Space 435 has been unselected and also grayed-out, as a result of the conflict resolution.

Referring back to FIG. 3, if the abstract data element passed the associated abstract rules, the method 300 proceeds to update the abstract data element by copying the current state to next state at block 370. The Update Utility 214 may be utilized to accomplish the updates.

Figure 6:
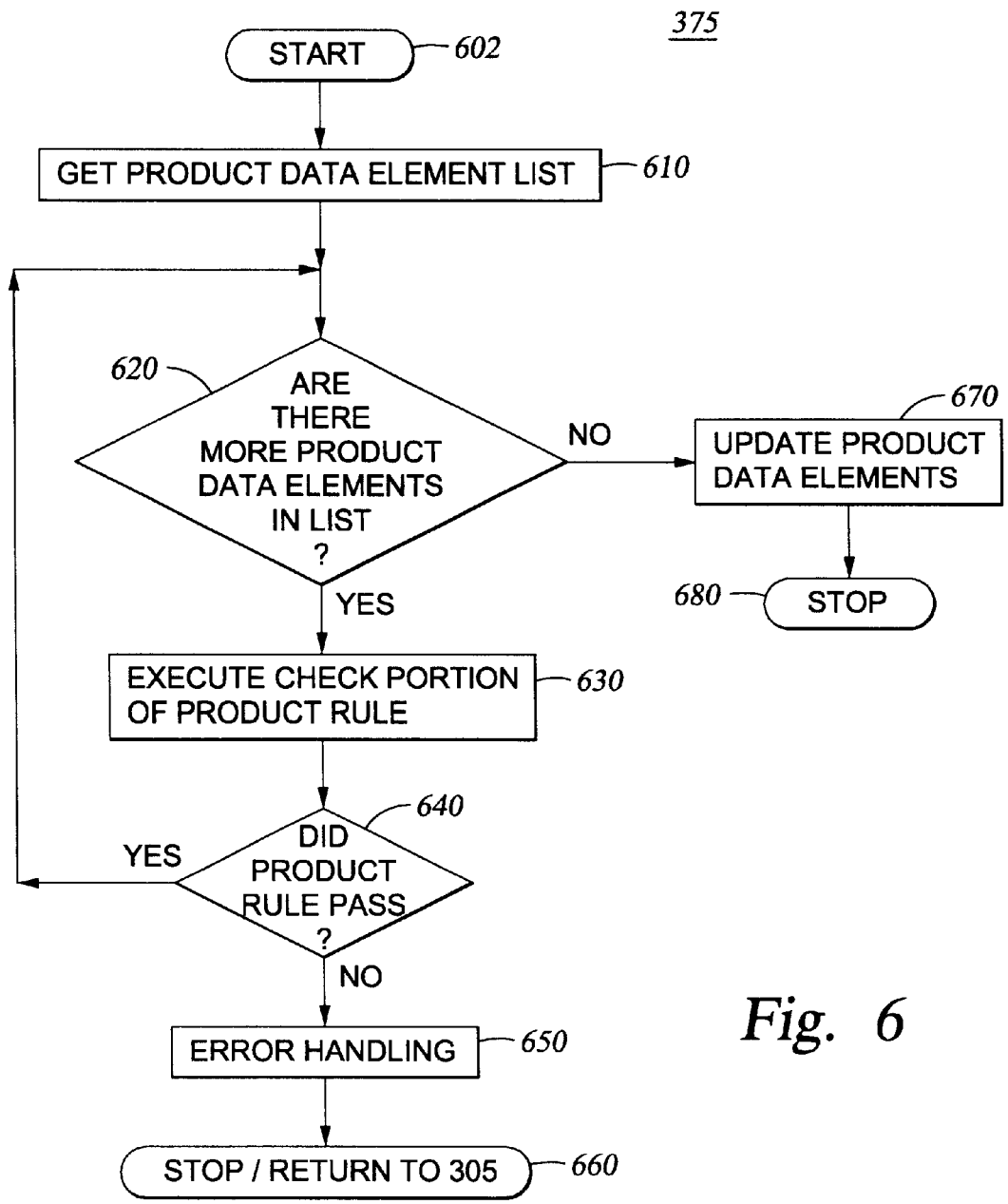
FIG. 6 is a flow diagram illustrating one embodiment of a process for checking product rules.

The method 300 then checks the product rules for the product data elements at block 375. FIG. 6 is a flow diagram illustrating one embodiment of a process 375 for checking product rules for the product data elements. The process 375 begins at block 602 and proceeds to get a list of product data elements at block 610. Each product data element is processed through a do-loop starting at block 620, which is a query box determining whether any product data element remains to be processed. If so, the product rules associated with the product element is checked at block 630 utilizing the Rule Checker 216 and the product rules database 250. The process 375 then proceeds to determine whether the product rules pass for the product data element being processed currently at query block 640. If an error occurs with the rule checking (i.e., did not pass at block 640), the process 375 proceeds to an error handling procedure at block 650 and returns to get another user input (in block 305) at block 660. If the product rules pass for the product data element at block 640, the process 375 loops back to block 620 to process the next product data element. After all product data elements have been processed and passes all product rules, the process 375 proceeds to update each product element at block 670.

Figure 7:
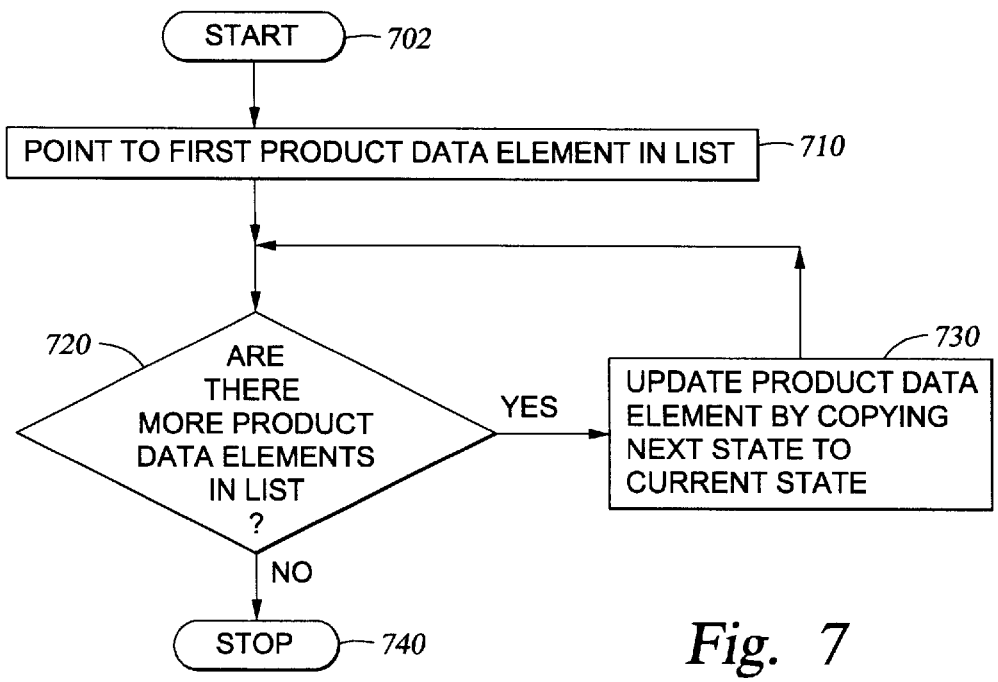
FIG. 7 is a flow diagram illustrating one embodiment of a process for updating product data elements.

FIG. 7 is a flow diagram illustrating one embodiment of a process 670 for updating product data elements. The process 670 begins at block 702 and proceeds to point to the first product data element in the list of product data elements retrieved previously at block 610. Each product data element is processed through a do-loop starting at block 720, which is a query box determining whether any product data element remains to be processed. If so, the product data element currently being processed is updated utilizing the Update Utility 214 by copying the next state to the current state at block 730. After all product data elements have been updated to the next state, the process 670 stops at block 740 and returns to process 375, which stops at block 680 and returns to stop at block 380 in the method 300 for configuring an integrated circuit.

Figure 8A:
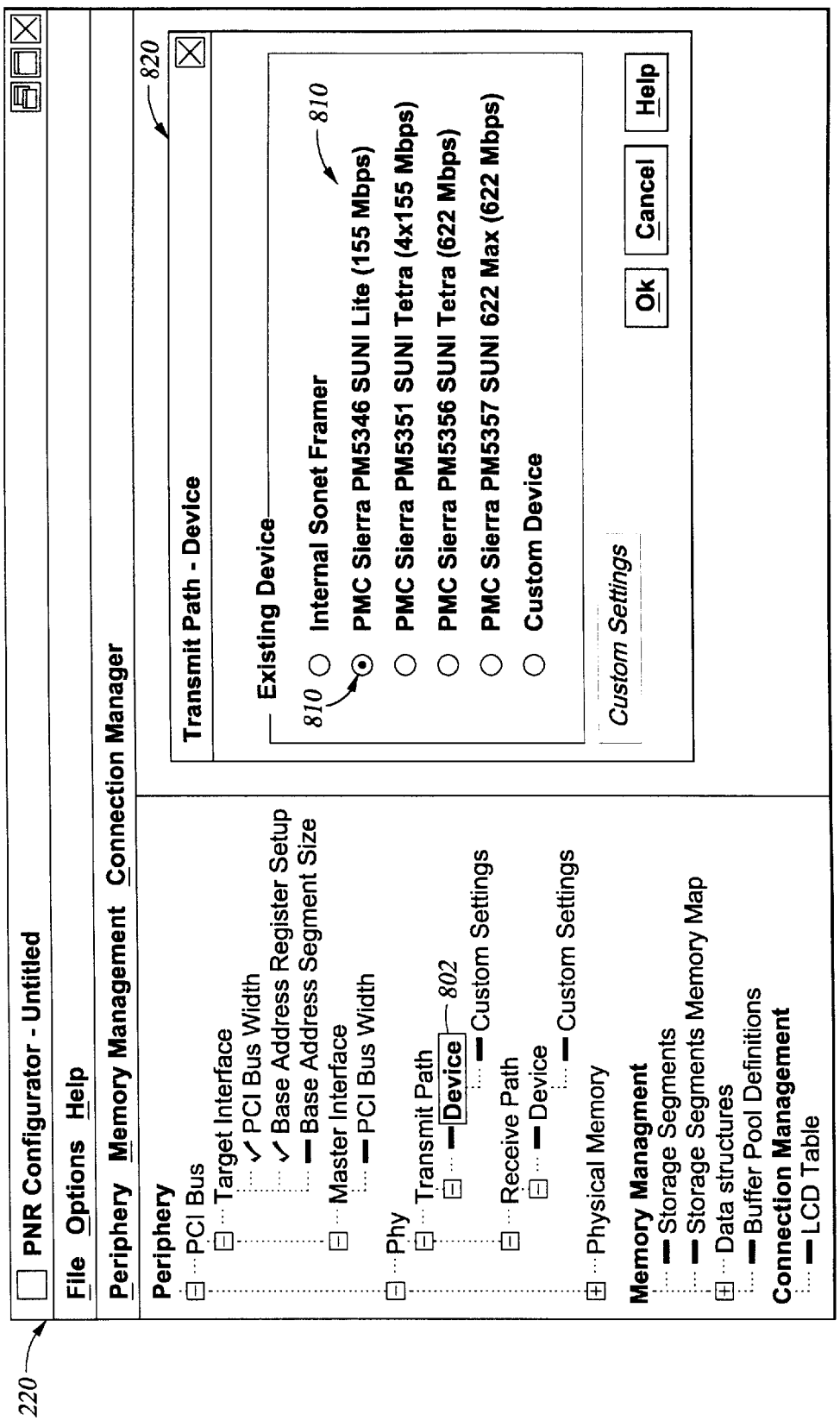
FIGS. 8A–D are exemplary embodiments of graphical user interfaces illustrating a high level abstraction for configuring a physical interface chip for a network processor.
Figure 8B:
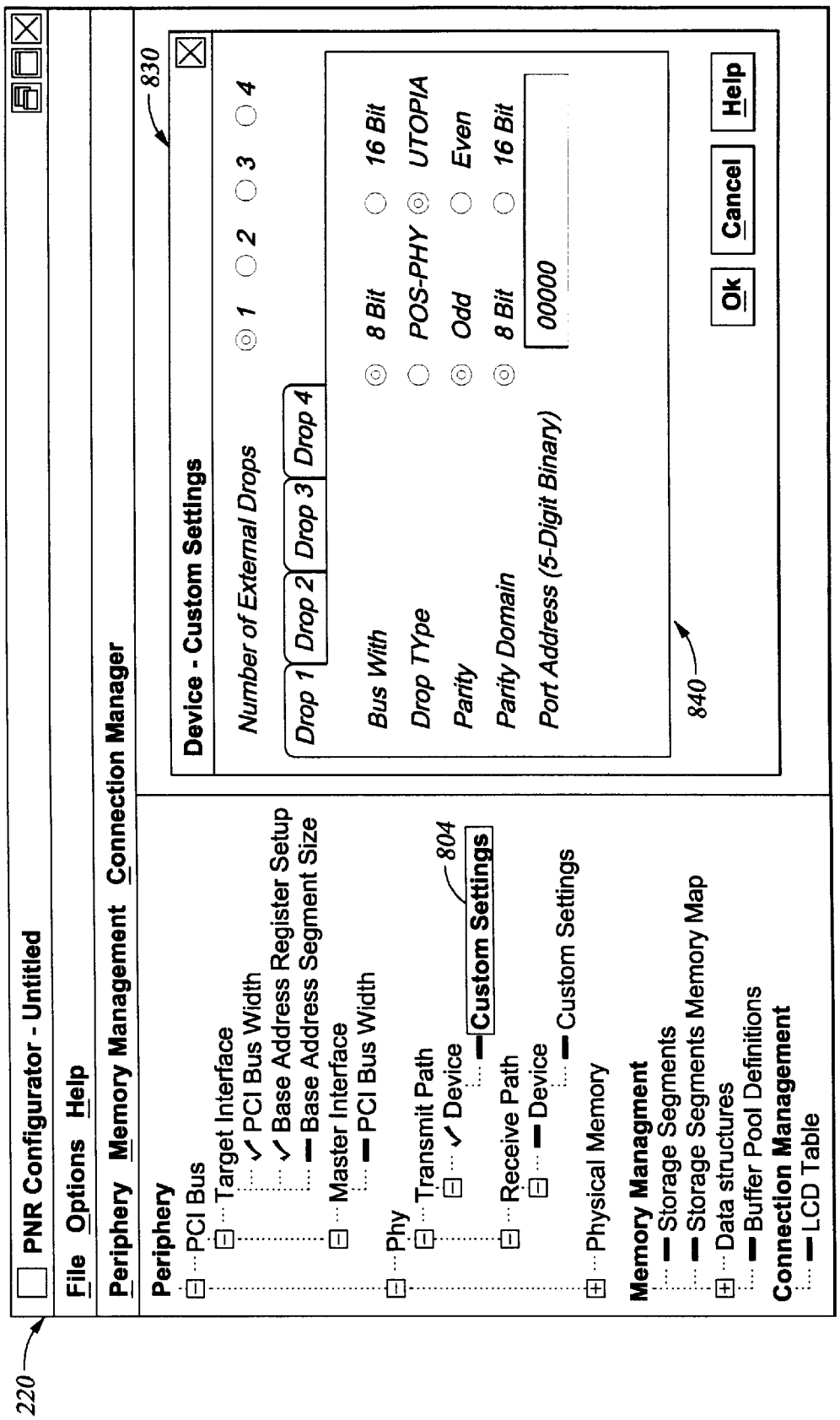
Figure 8C:
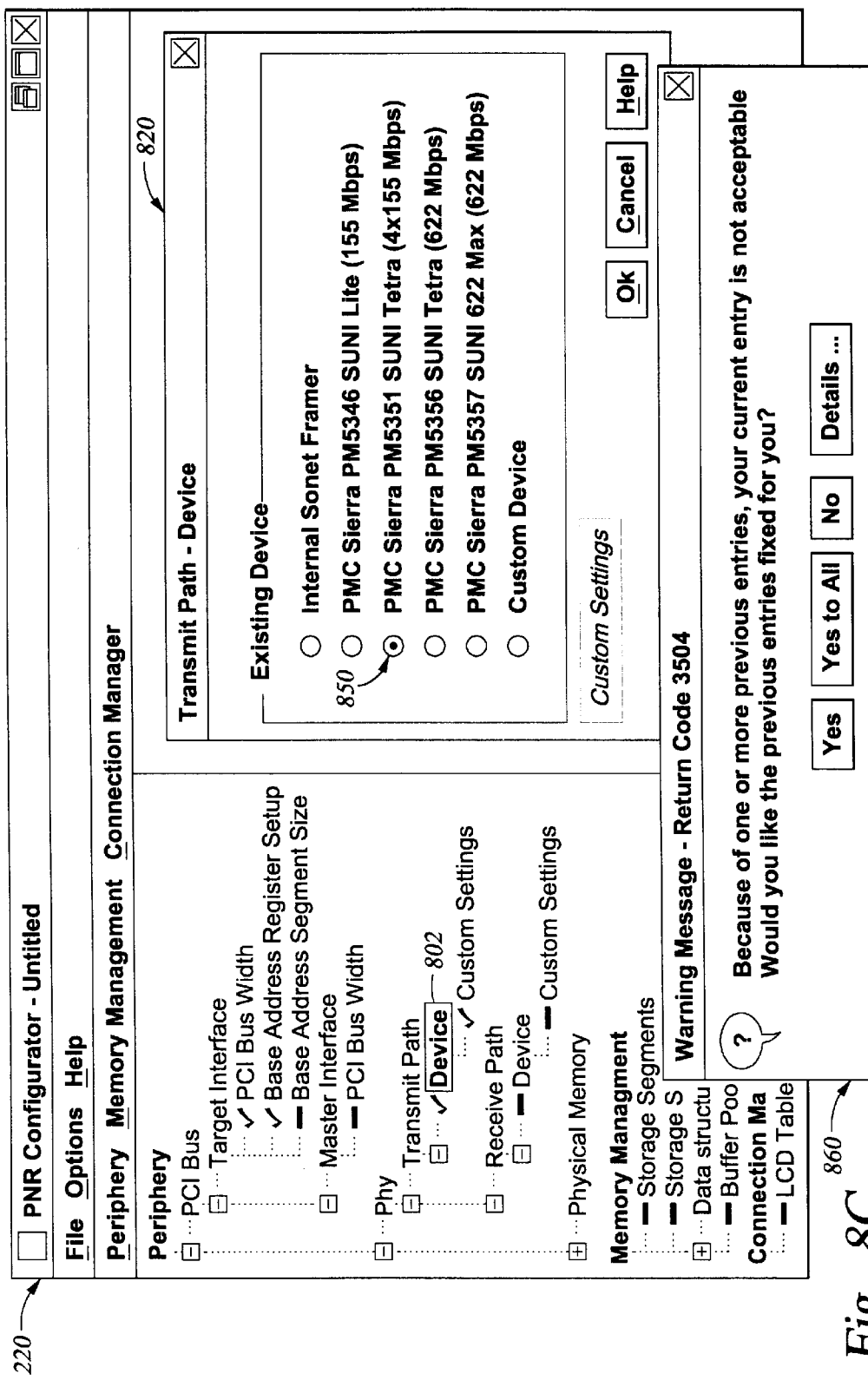
Figure 8D:
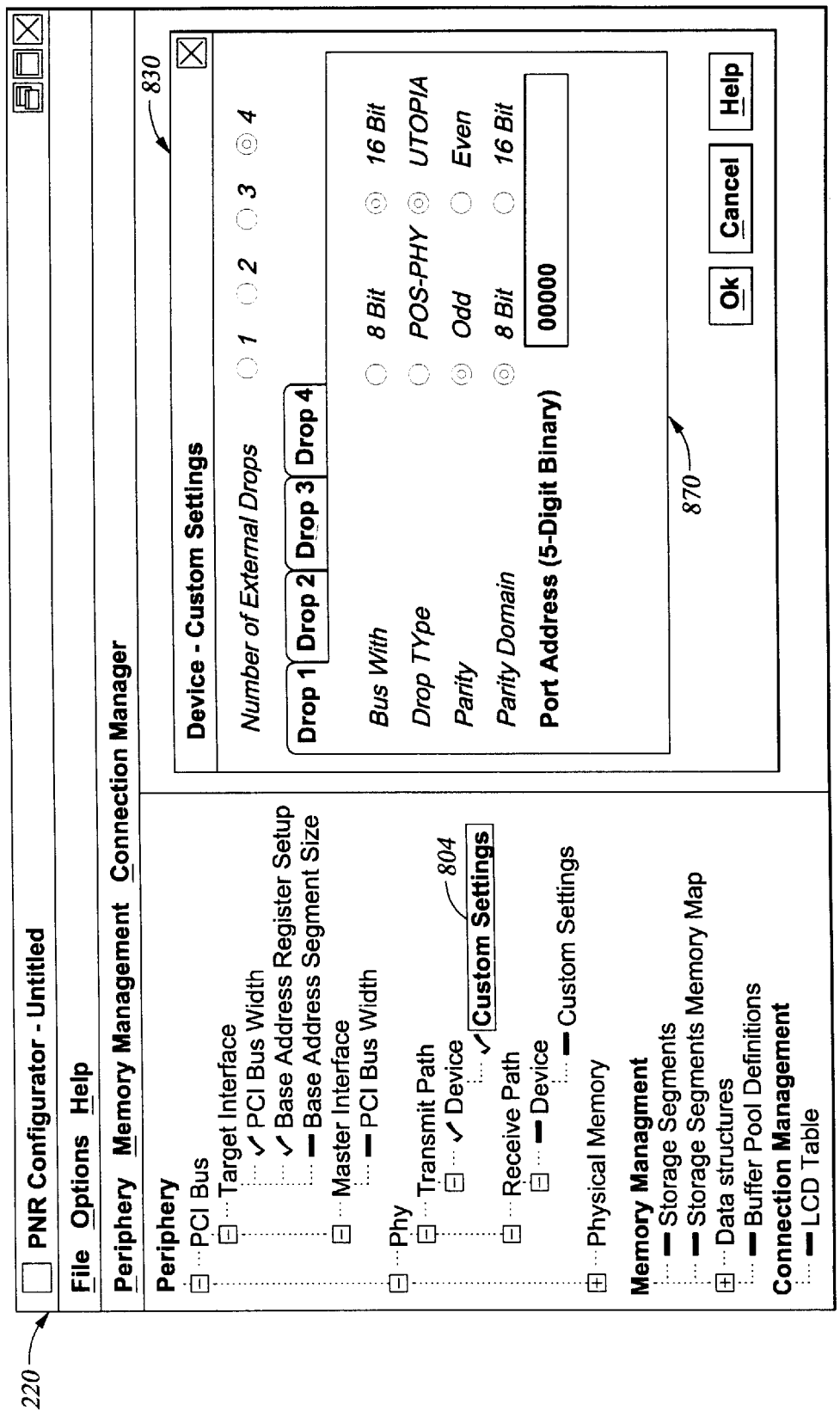

FIGS. 8A–D are exemplary embodiments of graphical user interfaces (Abstract Interface 220) illustrating a high level abstraction for configuring a physical interface chip for a network processor. FIG. 8A shows a user selection of the PHY/Transmit Path/Device subcategory 802 and a (155 Mbps) device 810 in a physical interface chip (PHY)/Transmit Path/Device dialog box 820. FIG. 8B shows a user selection of the PHY/Transmit Path/Device subcategory/Custom Settings 804. The results of the method 300, as shown in FIG. 8B, shows the Custom Settings dialog box 830 with the default product data element settings 840 for this device, which are configured by the configuration system 200. FIG. 8C shows the results of a user changing the device selection to the (4×155 Mbps) device 850 in the dialog box 820, which is an error warning dialog box 860 prompting the user to resolve the conflicts with previous selections. FIG. 8D shows the results of resolution of conflicts by the method 300 and the Custom Settings dialog box 830 with the default product data element settings 870 for the new device. As shown in FIGS. 8A–D, the IC configuration is greatly simplified because the user deals with higher level abstractions and need not understand and configure the lower level product data element settings for this device.

While the foregoing is directed to embodiments of the present invention, other and further embodiments of the invention may be devised without departing from the basic scope thereof, and the scope thereof is determined by the claims that follow.

What is claimed is:

1. A method for configuring an integrated circuit, comprising:
providing a user interface for displaying one or more abstract data elements for user selection, wherein the one or more abstract data elements represent one or more controls associated with characteristics of the integrated circuit;
receiving a user selection of an abstract data element;
validating associated abstract rules for the user selected abstract data element; and
validating product rules for one or more product data elements associated with the user selected abstract data element, wherein the one or more product data elements represent one or more controllable features of the integrated circuit.

2. The method of claim 1, further comprising:
if associated abstract rules fail validation, prompting user re-selection of abstract data element.

3. The method of claim 1, further comprising:
updating the user selected abstract data element and each product data element to a next state.

4. The method of claim 1, further comprising:
if associated abstract rules fail validation, resolving one or more conflicts between abstract rules.

5. The method of claim 4, further comprising:
after resolving conflicts, presenting one or more valid selections of abstract data elements for user selection.

6. The method of claim 1, further comprising:
initializing each product data element to a next state; and
validating the next state of each product data element.

7. The method of claim 6, further comprising:
displaying an error message if the next state of the product data element fails validation.

8. A system for configuring an integrated circuit, comprising:
a user interface for displaying one or more abstract data elements for user selection, wherein the one or more abstract data elements represent one or more controls associated with characteristics of the integrated circuit;
a configuration database containing an abstract rules database and a product rules database; and
a core tool connected to the user interface and the configuration database, the core tool configured to perform an operation comprising:
receiving a user selection of an abstract data element;
validating associated abstract rules for the user selected abstract data element; and
validating product rules for one or more product data elements associated with the user selected abstract data element, wherein the one or more product data elements represent one or more controllable features of the integrated circuit.

9. The system of claim 8, wherein the core tool is further configured to perform the step of:
if associated abstract rules fail validation, prompting user re-selection of abstract data element.

10. The system of claim 8, wherein the core tool is further configured to perform the step of:
updating the user selected abstract data element and each product data element to a next state.

11. The system of claim 8, wherein the core tool is further configured to perform the step of:
if associated abstract rules fail validation, resolving one or more conflicts between abstract rules.

12. The system of claim 11, wherein the core tool is further configured to perform the step of:
after resolving conflicts, presenting one or more valid selections of abstract data elements for user selection.

13. The system of claim 8, wherein the core tool is further configured to perform the step of:
initializing each product data element to a next state; and
validating the next state of each product data element.

14. The system of claim 13, wherein the core tool is further configured to perform the step of:

displaying an error message if the next state of the product data element fails validation.

15. The system of claim 8, wherein the core tool comprises:

an instructor for determining product data elements associated with the abstract data element, an update utility for updating fields in the configuration database; and a rule checker for checking the abstract rules and the product rules.

16. The system of claim 8, wherein the configuration database further comprises an abstract data element database, a product data element database, and a product data element list database containing lists of product data elements associated with the abstract data elements.

17. A signal bearing medium, comprising a program which, when executed by a processor, performs an operation for configuring an integrated circuit, the operation comprising:

providing a user interface for displaying one or more abstract data elements for user selection, wherein the one or more abstract data elements represent one or more controls associated with characteristics of the integrated circuit;

receiving a user selection of an abstract data element;

validating associated abstract rules for the user selected abstract data element; and validating product rules for one or more product data elements associated with the user selected abstract data element, wherein the one or more product data elements represent one or more controllable features of the integrated circuit.

18. The signal bearing medium of claim 17, wherein the operation further comprises:

if associated abstract rules fail validation, prompting user re-selection of abstract data element.

19. The signal bearing medium of claim 17, wherein the operation further comprises:

updating the user selected abstract data element and each product data element to a next state.

20. The signal bearing medium of claim 17, wherein the operation further comprises:

if associated abstract rules fail validation, resolving one or more conflicts between abstract rules.

21. The signal bearing medium of claim 20, wherein the operation further comprises:

after resolving conflicts, presenting one or more valid selections of abstract data elements for user selection.

22. The signal bearing medium of claim 17, wherein the operation further comprises:

initializing each product data element to a next state; and validating the next state of each product data element.

23. The signal bearing medium of claim 22, wherein the operation further comprises:

displaying an error message if the next state of the product data element fails validation.

* * * * *